US008940576B1

(12) United States Patent
Bui et al.

(10) Patent No.: US 8,940,576 B1
(45) Date of Patent: Jan. 27, 2015

(54) METHODS FOR N-TYPE DOPING OF GRAPHENE, AND N-TYPE-DOPED GRAPHENE COMPOSITIONS

(75) Inventors: Steven S. Bui, Simi Valley, CA (US); Jeong-Sun Moon, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 71 days.

(21) Appl. No.: 13/239,673

(22) Filed: Sep. 22, 2011

(51) Int. Cl.
*H01L 31/00* (2006.01)

(52) U.S. Cl.
USPC 438/99; 257/9; 257/24; 257/76; 257/E21.042; 257/E29.086; 438/478; 438/323

(58) Field of Classification Search
USPC ............ 257/9, 24, 76, E21.042, E29.086; 438/99, 478, 323
See application file for complete search history.

(56) References Cited

U.S. PATENT DOCUMENTS

| | | | | |
|---|---|---|---|---|
| 4,388,482 | A * | 6/1983 | Hamakawa et al. | 136/258 |
| 6,445,006 | B1 * | 9/2002 | Brandes et al. | 257/76 |
| 6,858,990 | B2 * | 2/2005 | Tsukamoto | 315/169.1 |
| 7,285,829 | B2 * | 10/2007 | Doyle et al. | 257/368 |
| 7,776,445 | B2 * | 8/2010 | Lee et al. | 428/408 |
| 8,354,323 | B2 * | 1/2013 | Bowers et al. | 438/311 |
| 2009/0142581 | A1 * | 6/2009 | Heintz et al. | 428/323 |
| 2010/0102292 | A1 * | 4/2010 | Hiura et al. | 257/9 |
| 2010/0108132 | A1 * | 5/2010 | Tsakalakos et al. | 136/256 |
| 2010/0127243 | A1 * | 5/2010 | Banerjee et al. | 257/39 |
| 2010/0132773 | A1 * | 6/2010 | Lagally et al. | 136/255 |
| 2010/0258786 | A1 * | 10/2010 | Wang et al. | 257/29 |
| 2011/0011629 | A1 * | 1/2011 | Trigwell et al. | 174/254 |
| 2011/0020211 | A1 * | 1/2011 | Jayatissa | 423/447.2 |
| 2011/0300058 | A1 * | 12/2011 | Strupinski | 423/448 |
| 2012/0068157 | A1 * | 3/2012 | Kub | 257/15 |
| 2012/0141799 | A1 * | 6/2012 | Kub et al. | 428/408 |
| 2013/0048339 | A1 * | 2/2013 | Tour et al. | 174/126.1 |
| 2013/0171452 | A1 * | 7/2013 | Goela et al. | 428/408 |

OTHER PUBLICATIONS

Panchakarla, et. al. "Synthesis, Structure, and Properties of Boron- and Nitrogen-Doped Graphene" Adv. Mat. 2009, 21, 4726-4730.*
Berger, et al. "Ultrathin Epitaxial Graphite: 2D Electron Gas Properties and a Route toward Graphene-based Nanoelectronics" J. Phys. Chem. 2004, 108, 19912-19916.*

(Continued)

*Primary Examiner* — Thao X Le
*Assistant Examiner* — Sheng Zhu
(74) *Attorney, Agent, or Firm* — O'Connor & Company

(57) ABSTRACT

The present invention provides practical methods for n-type doping of graphene, either during graphene synthesis or following the formation of graphene. Some variations provide a method of n-type doping of graphene, comprising introducing a phosphorus-containing dopant fluid to a surface of graphene, under effective conditions to dope the graphene with phosphorus atoms or with phosphorus-containing molecules or fragments. It has been found that substitutional doping with phosphine can effectively modulate the electrical properties of graphene, such as graphene supported on Si or SiC substrates. Graphene sheet resistances well below 200 ohm/sq, and sheet carrier concentrations above $5 \times 10^{13}$ cm$^{-2}$, have been observed experimentally for n-doped graphene produced by the disclosed methods. This invention provides n-doped graphene for various electronic-device applications.

21 Claims, 5 Drawing Sheets

(56) References Cited

OTHER PUBLICATIONS

Xinran Wang et al., "N-Doping of Graphene Through Electrothermal Reactions with Ammonia," Science 324, 768 (2009); DOI: 10.1126/science.1170335.

A. L. E. Garcia et al., "Influence of S and P Doping in a Graphene Sheet," Journal of Computational and Theoretical Nanoscience, vol. 5, No. 11, 1-9, 2008; doi:10.1166/jctn.2008.1123.

"3C-SiC Films Grown on Si(111) Substrates as a Template for Graphene Epitaxy" Mark Fanton, Joshua Robinson, Brian Weiland, and Jeong Moon, ECS Trans. 19, 131 (2009), DOI:10.1149/1.3119537 ("Fanto_2009a").

215th ECS Meeting, Abstract #1308, © The Electrochemical Society ("Fanton_2009b").

"3C-SiC films grown on Si(111) as a template for graphene epitaxy" M. Fanton, J. Robinson, X. Weng, B. Weiland, J. Moon Presentation at 215th ECS Meeting, San Francisco, CA; May 24-29, 2009 H10 -Graphene and Emerging Materials for Post-CMOS Applications ("Fanton_2009c").

Transfer of Large-Area Graphene Films for High-Performance Transparent Conductive Electrodes Xuesong Li et al., Nano Letters 2009 vol. 9, No. 12 4359-4363.

"Heteroepitaxial Growth of SiC on Si(100) and (111) by Chemical Vapor Deposition Using Trimethylsilane" S. Madapura, et al., Journal of the Electrochemical Society, 146 (3) 1197-1202 (1999).

"Epitaxial graphene on cubic SiC(111)/Si(111) substrate," Ouerghi et al., Applied Physics Letters 96, 191910 (2010).

"Growth pyramids on Si111 facets: A CVD and MBE study", J. van Wingerden et al., Physical Review B vol. 57, No. 12 Mar. 15, 1998-II.

"Patenting Graphene: Opportunities and Challenges," Baluch et al., Nanotechnology Law & Business Fall 2008 vol. 5 No. 3, 101-112.

"Epitaxial graphene", Walt A. de Heer et al., Preprint submitted to Solid State Communications Jul. 10, 2007.

"Contact and edge effects in graphene devices," Eduardo J. H. Lee et al., nature nanotechnology Advance Online Publication Published online: Jun. 29, 2008; doi:10.1038/nnano.2008.172.

Stephen Saddow; Eid and Galben, eds., "3C-SiC growth on Si substrates via CVD: An introduction" Physics of Advanced Materials Winter School 2008.

"Epitaxial Graphene Field Effect Transistors on Silicon Substrates," Hyun-Chul Kang et al., 978-1-4244-4353-6/09/2009 IEEE ("Kang_2009a").

"Epitaxial Graphene Top-Gate FETs on Silicon Substrates," Hyun-Chul Kang et al., ISDRS 2009, Dec. 9-11, 2009, College Park, MD, USA, ISDRS 2009—http://www.ece.umd.edu/ISDRS2009, 978-1-4244-6031-1/09 2009 IEEE ("Kang_2009b").

"Large-Area Graphene-Based Flexible Transparent Conducting Films," Fethullah Gunes et al., NANO: Brief Reports and Reviews vol. 4, No. 2 (2009) 83-90, World Scientific Publishing Company.

"A self-consistent theory for graphene transport," Shaffique Adam et al., 18392-18397 PNAS Nov. 20, 2007 vol. 104 No. 47 www.pnas.org/cgi/doi/10.1073/pnas.0704772104.

Non-Final Office Action in U.S. Appl. No. 12/985,345, dated Apr. 7, 2014.

* cited by examiner

FIG. 4

| EM-Run # | Substrate ID# | Doping Time (min.) | PH$_3$ flow rate (sccm) | Tencor (ohm/sq) | Contactless Hall Measurement | | | Comments |
|---|---|---|---|---|---|---|---|---|
| | | | | | ρ (ohm/sq) | n$_s$ (cm$^{-2}$) | μ (cm$^2$/V·s) | |
| EM-10-110 | 4" Si(111) | 0 | 0 | 4,818 | 11,378 | 8.94E+11 | 631 | As-grown |
| EM-10-111 | 4" Si(111) | 30 | 75 | 2,973 | 5558 | 2.74E+12 | 414 | diffusion |
| EM-10-116 | 4" Si(111) | 30 | 75 | 1,527 | 2276 | 2.14E+13 | 128 | Simultaneous doping |
| EM-10-124 | 3" Si(100) Nova | 30 | 75 | 1,497 | 1584 | 2.38E+13 | 171 | Simultaneous doping |

FIG. 5

| Substrate ID# | Doping Time (min.) | PH$_3$ flow rate (sccm) | Tencor (ohm/sq) | Non-contact LH | | |
|---|---|---|---|---|---|---|
| | | | | ρ (ohm/sq) | n$_s$ (cm$^{-2}$) | μ (cm$^2$/V.s) |
| SiC | 0 | 0 | 1,988 | 888 | 1.44E+13 | 508 |
| SiC | 15 | 75 | 1,832 | N/A | N/A | N/A |
| SiC | 30 | 75 | 139 | 138.5 | 5.02E+13 | 852 |

METHODS FOR N-TYPE DOPING OF GRAPHENE, AND N-TYPE-DOPED GRAPHENE COMPOSITIONS

FIELD OF THE INVENTION

The present invention generally relates to graphene, n-type doping of graphene, and doped graphene compositions, structures, and electronic components.

BACKGROUND OF THE INVENTION

Graphene is a single layer of carbon atoms densely packed in a honeycomb crystalline-lattice configuration. This atomic configuration gives rise to a high current-carrying capacity, excellent thermal conductivity, and low-voltage operational potential. Graphene therefore possesses the properties to be an excellent component of integrated circuits. For example, graphene has a high charge-carrier mobility as well as low noise, allowing it to be used as a channel in a field-effect transistor (FET). Development of epitaxial graphene FETs on the wafer scale is highly desirable for future graphene electronics.

Commercial and military interest in graphene-based electronic components includes sophisticated imaging systems as well as radar and communications applications, which have been hindered by component cost, limited resolution, and high power dissipation. A graphene platform could revolutionize these applications because of graphene's electrochemical properties and low cost, allowing for scalability and system-wide integration of graphene-based components.

To realize graphene-based circuits, various types of graphene are needed. Modulation of the electrical properties of graphene is of great technological importance. Doping graphene with other elements is a promising way to modulate electrical properties. Theoretical studies and experiments have shown that doping graphene can tailor the physical and chemical properties of graphene and open possibilities of new chemistry and new physics on graphene.

Doping is a common approach to tailor the electronic properties of semiconductor materials. Graphene is readily p-doped (positive charge carriers) by adsorbates, but for device applications, it would be useful to generate n-doped graphene. Up to now, most researchers have studied n-doped graphene using nitrogen.

For example, in "Synthesis of N-Doped Graphene by Chemical Vapor Deposition and Its Electrical Properties" by D. Wei, et al. (Nano Letters, vol. 9, No. 5, pages 1752-1758, March 2009), it is disclosed that ammonia may be introduced to synthesize substitutionally doped graphene at temperatures around 800° C. Other references discussing N-doping with nitrogen include "Electrical Properties of Nitrogen-/Boron-Doped Graphene Nanoribbons With Armchair Edges", by S. S. Yu, et al. (*IEEE Transactions on Naotechnology*, Vol. 9, No. 1, pages 79-81, January 2010); "Nitrogen-doped graphene and its electrochemical applications" by Y. Shao, et al. (*Journal of Materials Chemistry*, 20, 7491-7496, June 2010); and "Synthesis, Structure, and Properties of Boron- and Nitrogen-Doped Graphene", by L. S. Panchakarla, et al. (*Advance Materials*, 21, 4726-4730, 2009). These references do not describe or suggest n-type doping of graphene with phosphorus atoms or with phosphorus-containing molecules or fragments.

What are needed are practical methods for n-type doping of graphene, either during graphene synthesis or following the formation of graphene. There is a need in the art for n-doped graphene for various electronic-device applications.

SUMMARY OF THE INVENTION

The present invention addresses the aforementioned needs in the art, as will now be summarized and further described in detail herein.

In some variations, the invention provides a method of n-type doping of graphene, the method comprising introducing a phosphorus-containing dopant fluid to a surface of graphene, under effective conditions to dope the graphene with phosphorus atoms or with phosphorus-containing molecules or fragments.

Other variations of the invention provide a method of forming n-doped graphene, the method comprising growing graphene while simultaneously introducing a phosphorus-containing dopant fluid to dope the graphene, during graphene growth, with phosphorus atoms or with phosphorus-containing molecules or fragments.

In some embodiments, the phosphorus-containing dopant fluid comprises phosphine gas. In certain embodiments, the phosphorus-containing dopant fluid consists essentially of phosphine gas.

In some embodiments, the phosphorus-containing dopant fluid comprises a phosphine derivative, $PR_1R_2R_3$ wherein each of $R_1$, $R_2$, and $R_3$ are independently selected from hydrogen, a hydroxyl group, or hydrocarbon groups capable of bonding with phosphorus, and wherein at least one of $R_1$, $R_2$, and $R_3$ is not hydrogen.

The phosphorus-containing dopant fluid may alternatively, or additionally, comprise a halogenated phosphine derivative, phosphine oxide, and/or a phosphine oxide derivative.

The doping may include substitutional doping of the phosphorus-containing molecules or fragments into graphene. The doping may include substitutional doping of phosphine or a phosphine fragment into graphene. The doping may include substitutional or interstitial doping of phosphorus atoms into graphene. In some embodiments, hydrogen is incorporated into graphene during the doping.

In some embodiments, the graphene to be doped is supported on a Si substrate, a SiC substrate, or another type of substrate.

This invention also provides an n-doped graphene composition comprising graphene and phosphorus-containing molecules or fragments substitutionally doped within the graphene. The n-doped graphene composition may be substitutionally doped with phosphine or a phosphine fragment, a phosphine derivative (e.g., including a hydroxyl or hydrocarbon group), a halogenated phosphine derivative, phosphine oxide, and/or a phosphine oxide derivative, or fragments thereof. The n-doped graphene composition may include hydrogen.

Some embodiments provide a supported graphene composition that includes a substrate for graphene. The substrate may be selected from Si or SiC, for example. The substrate itself may be doped with the phosphorus-containing molecules or fragments, in certain embodiments.

In some embodiments, the supported graphene composition has a sheet-carrier concentration of about $10^{12}$ cm$^{-2}$ or higher, such as $10^{13}$ cm$^{-2}$, $5 \times 10^{13}$ cm$^{-2}$, $10^{14}$ cm$^{-2}$, or higher.

Certain embodiments provide a multi-layer graphene composition wherein at least one graphene layer comprises an n-doped graphene composition as disclosed.

An n-doped graphene composition as disclosed may be utilized in a carbon nanostructure, a graphene field-effect transistor, or any other device.

BRIEF DESCRIPTION OF THE DRAWINGS

FIG. 4 is a table of electrical results for phosphine doping of graphene using different doping methods and substrates, as described in Example 2.

FIG. 5 is a table of electrical results for phosphine doping of graphene on SiC substrates, as described in Example 3.

DETAILED DESCRIPTION OF EMBODIMENTS OF THE INVENTION

Figure 1:
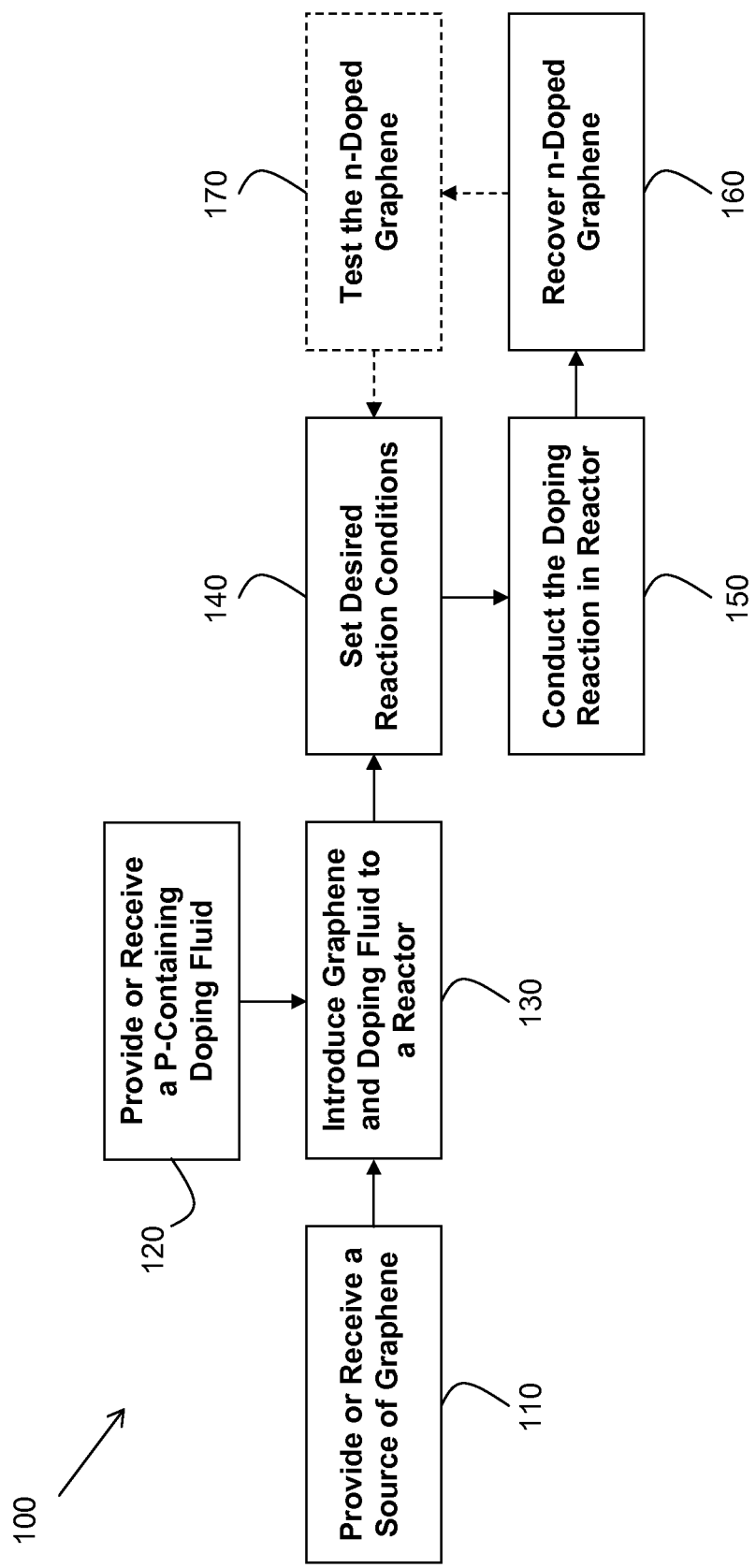
FIG. 1 is a flowchart summarizing an exemplary method for producing n-doped graphene, according to some embodiments of the invention.

Unless otherwise indicated, all numbers expressing dimensions, conductivities, resistances, and so forth used in the specification and claims are to be understood as being modified in all instances by the term "about." Without limiting the application of the doctrine of equivalents to the scope of the claims, each numerical parameter should at least be construed in light of the number of reported significant digits and by applying ordinary rounding techniques.

As used in this specification and the appended claims, the singular forms "a," "an," and "the" include plural referents unless the context clearly indicates otherwise.

The structures and methods of the present invention will be described in detail by reference to various non-limiting embodiments of the invention, including the figures which are provided to depict certain embodiments but not to limit the scope of the invention in any way.

In some variations, the present invention provides a method of n-type doping of graphene, the method comprising introducing a phosphorus-containing dopant fluid to an exposed surface of graphene, under effective conditions to dope the graphene with phosphorus atoms or with phosphorus-containing molecules or fragments. Effective conditions will be discussed below and mean conditions under which graphene is substitutionally or interstitially doped with phosphorus atoms and/or phosphorus-containing molecules or fragments.

"Graphene," as intended herein, includes graphene and related $sp^2$ graphitic allotropes that are typically planar, although not necessarily flat. Graphene is a monolayer of carbon atoms tightly packed into a two-dimensional honeycomb lattice, and is a basic building block for graphitic materials of other dimensionalities. Graphene can be wrapped up into zero-dimensional fullerenes, rolled into one-dimensional nanotubes, or stacked into three-dimensional graphite, for example.

Doping is generally the process of changing the electronic properties of graphene by adding dopants or doping materials. As used herein, "n-type doping" is used interchangeably with "n-doping," "n+ doping," or "electron addition," which refer to methods in which a dopant atom, molecule, or fragment is capable of providing extra conduction electrons to a host graphene material. The extra conduction electrons creates an excess of negative (n-type) electron charge carriers, increasing the free-electron concentration in graphene. As used herein, "n-doped graphene" means graphene that includes n-type dopants.

A phosphorus-containing dopant fluid may be a gas, a vapor, a liquid, or a mixture thereof. Typically, the dopant fluid will be a gas or a vapor, especially when the doping is conducted at elevated temperatures, such as when doping is combined with graphene formation as will be described below in connection with some embodiments.

In some preferred embodiments, the phosphorus-containing dopant fluid comprises, or consists essentially of, phosphine gas. Phosphine, with chemical formula $PH_3$, is a colorless, flammable, toxic gas. Small amounts of diphosphine, $P_2H_4$, may be present with phosphine.

Phosphine may be prepared in a variety of ways, as is known. Phosphine can be made by the reaction of phosphorus with sodium hydroxide, producing sodium hypophosphite and sodium phosphite as a by-product. Alternatively, the acid-catalyzed disproportioning of phosphorus may be used, which yields phosphoric acid and phosphine. The acid route is a preferred method if further reaction of the phosphine to phosphine derivatives is desired. Phosphine can also be made by the hydrolysis of a metal phosphide such as aluminum phosphide or calcium phosphide. Pure phosphine, free from $P_2H_4$, may be prepared using the action of potassium hydroxide on phosphonium iodide ($PH_4I$).

Phosphine derivatives may also be utilized in place of phosphine, or in addition to phosphine, as the phosphorus-containing dopant fluid. A "phosphine derivative" as intended herein is any molecule or fragment in which at least one of the hydrogen atoms of phosphine is replaced with another element or group, or in which another element or group is bonded with phosphorus in addition to the three hydrogen atoms (e.g., phosphine oxide, $OPH_3$).

In some embodiments, phosphine derivatives have the chemical formula $PR_1R_2R_3$ wherein at least one of $R_j$ ($R_1$, $R_2$, and/or $R_3$) is a hydrocarbon group capable of bonding with phosphorus (j is an index, not a stoichiometric number). $PR_1R_2R_3$ is typically a trigonal pyramidal molecule with each $R_j$ group bonding to the P atom:

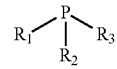

A "hydrocarbon group" contains at least carbon and hydrogen, and may contain other elements. Hydrocarbon groups capable of bonding with phosphorus may include, but are not limited to, alkyl groups (e.g., methyl, ethyl, isopropyl, or n-butyl groups), aryl groups (e.g., phenyl, tolyl, or indolyl groups), olefin groups (e.g., ethyl), cyclic alkyl groups (e.g., cyclohexyl), cyclic olefin groups (e.g., cyclopentenyl), and so on.

In some embodiments, one of the hydrogen atoms in phosphine is replaced with a hydrocarbon group to form $PH_2R_1$. In some embodiments, two of the hydrogen atoms in phosphine are replaced with hydrocarbon groups to form $PHR_1R_2$. In certain embodiments, all three of the hydrogen atoms in phosphine are replaced with hydrocarbon groups to form $PR_1R_2R_3$ as the phosphorus-containing dopant fluid.

In these or other embodiments, one of the hydrogen atoms in phosphine is replaced with a halogen atom (e.g., Cl, F, Br, or I). In some embodiments, two of the hydrogen atoms in phosphine are replaced with halogen atoms. In certain embodiments, all three of the hydrogen atoms in phosphine are replaced with halogen atoms. Exemplary phosphorus-containing dopant fluids comprising halogens are $PH_2Cl$, $PHBrI$, and $PCl_3$.

In these or other embodiments, one of the hydrogen atoms in phosphine is replaced with a hydroxyl group (—OH). In some embodiments, two of the hydrogen atoms in phosphine are replaced with hydroxyl groups. In certain embodiments, all three of the hydrogen atoms in phosphine are replaced with hydroxyl groups. Phosphorus-containing dopant fluids comprising hydroxyl groups include $PH_2OH$, $PH(OH)_2$, and $P(OH)_3$.

In some embodiments, a phosphine oxide derivative is employed as the phosphorus-containing dopant fluid. A phosphine oxide derivative may be similar to any of the above-described phosphine derivatives, except that an oxygen atom is also bonded directly to phosphorus. Phosphine oxide derivatives may include, for example, $OPR_1R_2R_3$, $OPCl_3$, or $OPH_2Cl$.

Each substituted hydrogen in a particular phosphine derivative may be independently selected from hydrogen or another species or group, and may be all the same, or two of them may be the same, or all three may be the same. Various combinations are possible, such as $PH(CH_3)Br$ or $P(C_2H_5)(OH)Cl$. Also, phosphorus-containing dopant fluids may include multiple species, such as a mixture of phosphine and trimethylphosphine, $P(CH3)_3$.

The atom, compound, or fragment that remains in the graphene may be different than the starting material dopant fluid. The reason is that during the doping process, there may be some degree of chemical reaction involving release of a portion of the starting material, such as release of hydrogen or methane. Thus, what is actually doped may be elemental phosphorus (either as atomic P itself or as molecular $P_2$, etc.); a phosphorus-containing molecule (including phosphine or a phosphine derivative); or a phosphorus-containing fragment derived from phosphine or a phosphine derivative. A phosphorus-containing fragment may be charged (negative or positive) or uncharged, and may include free radicals; such fragments may include $PH_4^+$, $PH_2^-$, $.PH_2$, or $PH^{2-}$, for example. Of course, a phosphorus-containing molecule or fragment may include elemental phosphorus, present chemically as phosphorus single atoms and/or as oligomers of phosphorus, such as $P_2$, $P_4$, $P_5$, or another form of phosphorus atoms.

Doping may be substitutional, interstitial, or a combination of the two. Substitutional doping means that a dopant species replaces a carbon atom in graphene. Interstitial doping means that a dopant species intercalates into graphene in space between carbon atoms, but does not replace a carbon atom. Larger molecules tend to dope substitutionally rather than interstitially. As a rule of thumb, substitutional doping is preferred over interstitial doping, for more effectively modulating electrical properties. Without being limited by any particular theory, the dominant doping mechanism for phosphorus-containing dopant fluids is expected to typically be substitutional. In some embodiments, phosphorus atoms derived from phosphorus-containing dopant fluids are interstitially doped into graphene.

Combined substitutional-interstitial doping can occur when a portion of a dopant species replaces carbon atoms while another portion of the dopant species intercalates between carbons. In another type of combined substitutional-interstitial doping, a dopant molecule or fragment that is larger than a single atom is introduced into graphene, wherein one dopant atom replaces a carbon in graphene while at least one other atom is present without replacing any carbons, i.e., is disposed interstitially. Phosphine may dope in this manner, in some embodiments, when a phosphorus atom replaces a carbon atom while at least one of the hydrogen atoms in $PH_3$ dopes interstitially into graphene. Some of the hydrogen atoms may instead be disposed outside the plane of graphene, or evolve as (for example) hydrogen gas ($H_2$), methane ($CH_4$), or another molecule.

Generally, in some embodiments hydrogen is incorporated into graphene during the doping process, wherein the hydrogen is derived from the starting phosphine or phosphine derivative. The hydrogen may be incorporated in any form, such as H, $H_2$, $H^+$, $H^-$, $H_2^-$, etc. Hydrogenation of graphene may or may not be desired. The extent of hydrogenation during doping would typically represent far less than stoichiometric amounts of hydrogen (H:C=1:1) that would convert graphene into graphane, a two-dimensional polymer of carbon and hydrogen in an $sp^3$ bonding configuration.

The present invention is by no means limited to any particular doping mechanism, or to any particular dopant concentrations. The amount of the phosphorus-containing dopant fluid will typically be selected to achieve desired electronic properties of the doped graphene, either through experimentation or according to theoretical considerations. The desired amount of doping may be based on the desired phosphorus atom concentration (even if other atoms are also being incorporated into graphene), or the desired electron concentration, such as electrons per cubic atomic unit. The phosphorus atom concentration in doped graphene may be expressed as the ratio of elemental phosphorus to elemental carbon, P/C. This P/C ratio may vary widely, such as P/C values on the order of $10^{-6}$, $10^{-5}$, $10^{-4}$, $10^{-3}$, $10^{-2}$ or higher. Typically P/C will be in the range of $10^{-4}$ to $10^{-3}$.

A source of graphene may be doped using the compositions described herein after any period of time following graphene formation. Preferably, the period of time following graphene formation is relatively short, such as less than 1 hour, 30 minutes, 10 minutes, 5 minutes, 1 minute, 30 seconds, or 10 seconds following graphene formation. It has been found that exposing graphene to phosphine immediately after growing graphene increases electron carrier concentrations and prevents surface oxidation. By "immediately after growing graphene," it is meant that doping occurs less than 1 minute following graphene formation, including essentially immediately following graphene formation.

In certain embodiments, the graphene is doped at the same time that the graphene is being formed. In these embodiments, n-doped graphene is formed by the growing graphene on a substrate while simultaneously introducing a phosphorus-containing dopant fluid to dope the graphene, during graphene growth, with phosphorus atoms or with phosphorus-containing molecules or fragments.

It should be understood that "simultaneously introducing" the dopant fluid while growing graphene should not be construed as requiring that doping is constantly applied during growth or that, on a molecular level, dopant species are introduced (whether substitutionally or interstitially) at the same time that carbon-carbon bond formation in graphene is occurring. When growing graphene on a substrate while simultaneously introducing a phosphorus-containing dopant fluid, at least some amount of doping of graphene takes place prior to the conclusion of formation of the graphene of interest (i.e., the graphene subject to doping).

Exemplary methods for doping graphene will be discussed, including by reference to the method/system flowcharts shown in FIG. 1 and FIG. 2. While a certain order is suggested by these flowcharts, it will be understood that the order of steps may be varied. Dotted lines (boxes) and dotted arrows denote optional steps.

In the embodiments depicted in FIG. 1, the method 100 comprises the following steps. Step 110 comprises receiving or providing a graphene substrate, such as by growing graphene or obtaining a source of graphene (supported or unsupported). Step 120 comprises receiving or providing a selected phosphorus-containing doping fluid, such as (but not limited to) phosphine. Step 130 comprises introducing the graphene and the phosphorus-containing doping fluid to a reactor for carrying out the doping reaction. Step 140 comprises setting (e.g., establishing, or adjusting to, and/or measuring) selected reaction conditions. Step 150 comprises conducting the doping chemical reaction(s) involving phosphorus. Step 160 comprises recovering n-doped graphene comprising phosphorus. Step 170, which is optionally employed, comprises one or more tests or measurements on the n-doped graphene. There may be process feedback from results of the tests or measurements back to a previous step, in particular step 140 to adjust reaction conditions based on the graphene doping performance.

Figure 2:
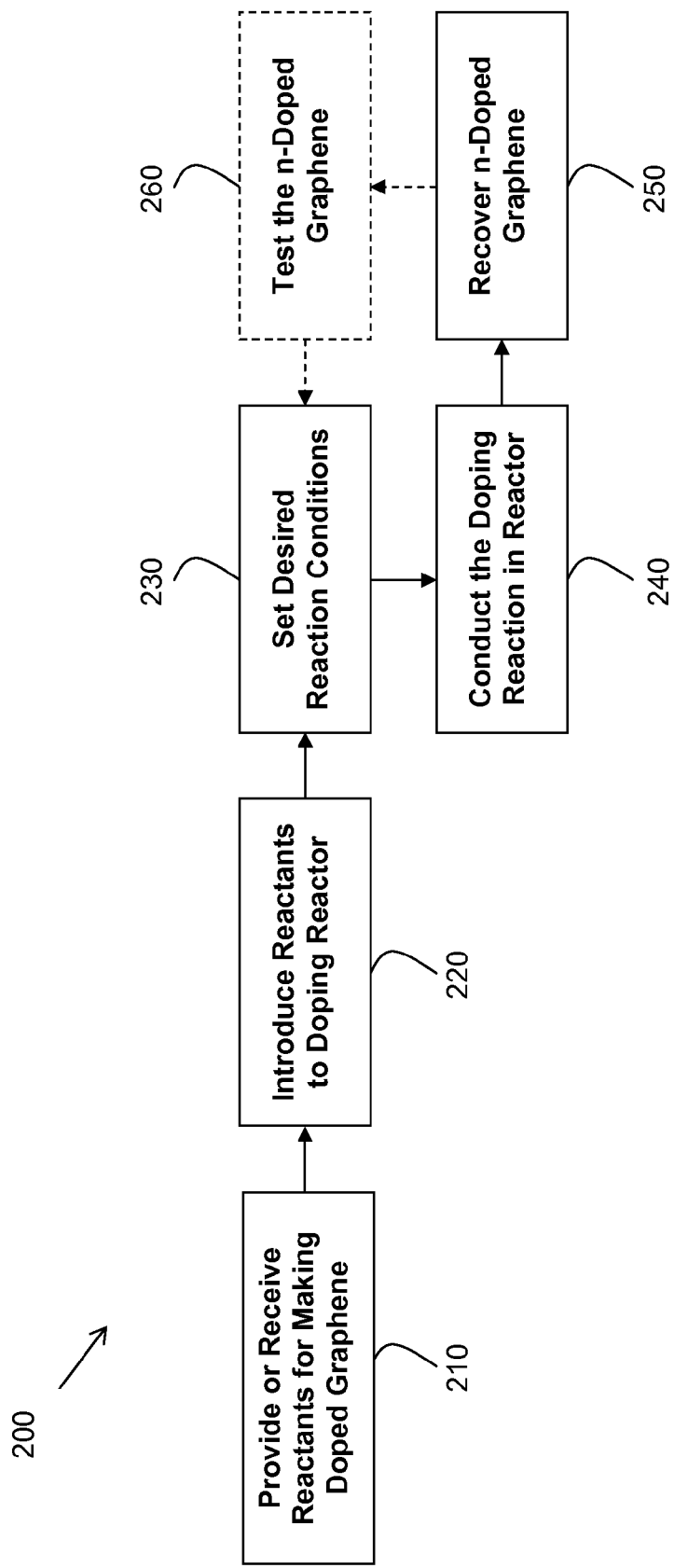
FIG. 2 is a flowchart summarizing an exemplary method for producing n-doped graphene, according to some embodiments of the invention.

In the embodiments depicted in FIG. 2, the method 200 comprises the following steps. Step 210 comprises receiving or providing the reactants, including one or more precursors to graphene (such as described in detail below), optionally a support for graphene, and a phosphorus-containing doping fluid, such as (but not limited to) phosphine. Step 220 comprises introducing the reactants to a reactor for carrying out the graphene formation and simultaneous doping reaction. Step 230 comprises setting (e.g., establishing, or adjusting to, and/or measuring) selected reaction conditions. Step 240 comprises conducting the graphene synthesis and doping chemical reaction(s) involving phosphorus. Step 250 comprises recovering n-doped graphene comprising phosphorus. Step 260, which is optionally employed, comprises one or more tests or measurements on the n-doped graphene. There may be process feedback from results of the tests or measurements back to a previous step, in particular step 230 to adjust reaction conditions based on the doping performance and/or quality of graphene produced. It is noted that the method in FIG. 2 does not require any ex-situ annealing to activate the phosphorus donors, although in some embodiments, ex-situ annealing may be employed if desired.

A variety of operating temperatures, pressures, flow rates, and residence times can be employed for each step. As is known to a skilled artisan, the optimum conditions for each step may be influenced by the conditions of other steps. In general, the specific selection of temperatures, pressures, concentrations, and residence times (or flow rates) will be selected to provide, or will be subject to constraints relating to, an economically optimized process for producing n-doped graphene. The conditions of the reactor (in step 150 or step 240, in particular, are important because effective conditions are necessary to realize the desired doping chemistry. Exemplary effective conditions will now be further described.

The temperature will influence kinetics and thermodynamics of the chemistry, for doping in FIG. 1 or for combined doping and graphene synthesis in FIG. 2. In some embodiments, the reactor for graphene doping (and optionally graphene synthesis) is operated in a temperature range of from about 400° C. to about 1000° C., such as about 500° C., 600° C., 700° C., 750° C., 800° C., or 850° C.

The pressure will influence the species concentrations, mass transfer, and reaction dynamics, and possibly there are safety considerations dictating reduced pressures. In some embodiments, the reactor for graphene doping (and optionally graphene synthesis) is operated under vacuum. In some embodiments, the reactor is operated at a pressure from about 10 torr to about 760 torr, such as about 20 torr, 30 torr, 40 torr, or 50 torr. Pressures lower than 10 torr are possible but there will be a cost associated with maintaining this vacuum level. Pressures higher than 760 torr (atmospheric pressure) can be used, in some embodiments.

The residence time will determine the degree of reaction, i.e., extent of doping (FIG. 1) or extent of doping coupled with graphene synthesis (FIG. 2). In a batch reactor, the residence time is simply the batch time, which can be regarded as the time as temperature, once reached. In a continuous reactor, the residence time for a species is the reactor volume divided by the volumetric flow rate of that species. In some embodiments, the reactor is operated with a residence time for the doping species and/or for the graphene of from about 1 minute to about 24 hours, such as from about 10 minutes to about 1 hour, e.g. about 15 minutes or 30 minutes. Other residence times are possible.

It is possible for the graphene to be fixed in the reactor while the doping fluid is introduced and removed, after some of it reacts, continuously. In these embodiments, the graphene is essentially present in a batch mode while the doping species is fed continuously. The total time of exposure of the doping fluid to graphene may be calculated, rather than the instantaneous residence time. This total time of exposure for the doping fluid may be from about 1 minute to about 24 hours, such as from about 10 minutes to about 1 hour, e.g. about 15 minutes or 30 minutes. The flow rate of the doping fluid can also be measured or controlled; the necessary flow rate will depend on the size of the system.

In general, material streams produced or existing within the system can be independently passed to subsequent steps or removed/purged from the system at any point. Also, any of the materials present may be subjected to additional processing, including heat addition or removal, mass addition or removal, mixing, various measurements and sampling, and so forth.

In certain embodiments, the phosphorus-containing doping fluid consists essentially of phosphine gas. The phosphine gas may be introduce, for example, at a temperature of from about 600-900° C., a pressure of from about 10-50 torr, and a flow rate of from about 10-1000 standard $cm^3$ per minute (sccm). With larger systems, larger flow rates would be needed for the same degree of desired graphene doping. In some embodiments, inert gases such as nitrogen or argon are present with the phosphine, for safety or other reasons. In certain embodiments, 100% pure, or substantially pure (e.g., >99% pure), phosphine is utilized as the phosphorus-containing doping fluid.

Within the reactor for conducting the doping chemistry, i.e. during step 150 or step 240, there may be various chemical or physical mechanisms involved. Without being limited in any way by a particular hypothesis, it is believed that during the doping reaction, certain carbon-carbon bonds (contained in graphene) are broken, primarily due to thermal energy but also possibly catalyzed by phosphorus or a phosphorus-containing molecule or fragment. When a carbon-carbon bond breaks, a P atom or fragment may then bond with one of the carbon atoms, to form a carbon-phosphorus bond in substitutional doping.

Alternatively, or additionally, a P atom or fragment may diffuse into graphene between carbon-carbon bonds (e.g., in the lattice space of the graphene honeycomb) during interstitial doping. The carbon-carbon bond energy (bond strength) may be impacted while preserving the bond itself. While a P atom and smaller P-containing fragments may dope interstitially, larger ones may not be able to do so. As the size of the P-containing molecule or fragment increases, it becomes increasingly unlikely that the molecule or fragment could theoretically fit within the graphene lattice space without actually breaking carbon-carbon bonds.

In some embodiments employing phosphine gas ($PH_3$) as the doping fluid, the phosphine when subjected to effective reactor conditions for doping will decompose thermally to produce one or more of P atoms, P-containing oligomers (e.g., $P_2$ or $P_5$), or P-containing fragments (e.g., $PH_2^-$ or $PH^{2-}$). The phosphorus atom contained within at least a portion of the thermally decomposed phosphine will then diffuse and bond with a carbon-carbon bond, which is thermally or catalytically cleaved (or weakened). Alternatively, or additionally, the phosphorus atom contained with phosphine itself may diffuse and bond with a carbon atom, followed by removal of some or all of the hydrogen atoms from each $PH_3$ molecule. Also, as mentioned above, some amount of doping may occur interstitially, including with phosphine molecules themselves, i.e. without any decomposition.

In some embodiments employing phosphine gas ($PH_3$) as the doping fluid, the phosphine when subjected to effective reactor conditions for combined doping with graphene synthesis will decompose thermally to produce one or more of P atoms, P-containing oligomers (e.g., $P_2$ or $P_5$), or P-containing fragments (e.g., $PH_2^-$ or $PH^{2-}$). The phosphorus atom contained within at least a portion of the thermally decomposed phosphine will bond with a carbon atom, whether or not the carbon atom is, or has been, a part of a carbon-carbon graphene bond. Alternatively, or additionally, the phosphorus atom contained with phosphine itself may bond with a carbon atom, followed by removal of some or all of the hydrogen atoms from each $PH_3$ molecule. Also, some amount of doping may occur interstitially while graphene is being formed, including with phosphine molecules themselves, i.e. without any decomposition.

In some embodiments, the phosphorus-containing doping fluid is a liquid initially (i.e., when charging the reactor) or even under reaction conditions. In some embodiments, the fluid is a liquid that is vaporized, at least in part, under the pressure and temperature for the reactor. A multiphase doping fluid may result, at least for part of the doping reaction. It may be preferable to raise the temperature, or reduce the pressure, so that the doping fluid (or a component thereof) is above its boiling point.

It should also be recognized that a liquid-phase phosphorus-containing doping fluid may be employed, especially (but not exclusively) when doping follows graphene formation. When a liquid is used, doping may occur by similar mechanisms as described above, such as diffusion followed by reaction. When a liquid doping fluid is desired, doping temperatures less than 400° C. may be required unless very-high boiling-point liquids are employed. Extended residence times may be necessary to overcome relatively slow kinetics and mass transfer associated with liquid doping fluids. Also, continuous-stirred tank reactors may be preferred to enhance diffusion.

The reactor apparatus for carrying out the doping reaction may be designed, engineered, and operated in a wide variety of ways. The reactor operation (step 150 or step 240) may be continuous, semicontinuous, or batch. Cocurrent or countercurrent configurations are possible for continuous reactors. The flow pattern may be substantially plug flow, substantially well-mixed, or a flow pattern between these extremes. In some embodiments, the reactor is a batch chamber, such as a vacuum chamber. In some embodiments, the reactor comprises a fixed bed of graphene and fluidized phase of the doping fluid.

The graphene to be doped, sequentially (after graphene formation) or simultaneously with graphene growth, may be supported, or otherwise disposed on, a substrate to form a supported graphene composition. Exemplary substrates include, but are not limited to, silicon (Si), silicon carbide (SiC), silica ($SiO_2$), alumina ($AlO_2$), and combinations thereof.

Any crystal orientation may be used for substrates. For example, in the case of a Si substrate, any one or more of Si (111), Si (100), Si (011), or Si (222) crystal orientations may be utilized. A Si substrate may have multiple orientations present. Typically, silicon crystals are grown with either the (001) or (111) direction parallel to the cylindrical axis of the crystal. Wafers, however, may be cut either exactly perpendicular to the axis, or deliberately off-axis by several degrees. In some embodiments, a silicon substrate includes a silicon (111) surface in addition to one or more of a silicon (001) surface, a silicon (011) surface, and a silicon (222) surface.

Some embodiments utilize silicon crystals made by the well-known Czochralski process. Other embodiments employ float-zone silicon as the silicon substrate. Float-zone silicon is a high-purity silicon wherein the concentrations of light impurities, such as carbon and oxygen, are extremely low. Techniques for making float-zone silicon are well-known. Optionally, nitrogen can help to control microdefects and bring about an improvement in mechanical strength of the wafers.

Any crystal structure (polytype) may be used for substrates having multiple polytypes. For example, in the case of a SiC substrate, any one or more SiC polytypes 4H, 6H (or α), or 3C (or β) may be utilized. The 4H and 6H polytypes have a hexagonal crystal structure, while the 3C polytype has a cubic crystal structure.

The substrate itself may be intentionally doped, if desired, depending on the intended use of the structure. In some embodiments, the substrate is doped with one or more dopants separately from the desired graphene dopants, such as boron, arsenic, phosphorus, antimony, aluminum, and/or gallium. When dopants are desired, specialized doping techniques such as core doping, pill doping, and gas doping may be used to incorporate a uniform concentration of dopant species into the substrate. In other embodiments, the substrate is undoped, or at least not intentionally doped.

Optionally, the substrate may be doped with phosphorus atoms or with the phosphorus-containing molecules or fragments contained in the dopant fluid applied to the graphene. In some embodiments, a portion of the dopant (or molecules or fragments derived therefrom) is introduced through the graphene and into the substrate. Although typically such substrate doping might represent an inefficient use of the doping fluid, in certain embodiments it may be beneficial to also dope the substrate, such as Si, with phosphorus atoms or phosphorus-containing materials.

The graphene to be doped may be an epitaxial layer that is substantially pure graphene, although of course various impurities may be present in the graphene. In some embodiments, at least a portion of the graphene is present in chemically or electrochemically modified form, in a manner that is distinct from the phosphorus doping as provided herein. For example, the graphene may be doped with hydrogen, boron, or fluorine, or another dopant either at the time of graphene synthesis and phosphorus doping, or following graphene synthesis, or following both graphene synthesis and phosphorus doping.

There are various techniques to form graphene and related $sp^2$ graphitic structures. Graphene to be doped according to the present invention may be received, provided, or synthesized by mechanical exfoliation of graphite; chemical vapor deposition from hydrocarbon precursors, carbon-containing gases (such as CO, $CO_2$, or $CH_4$), or metal carbides; reduction of graphite oxide; carbon-atom sputtering; and catalytic decomposition of carbon-containing materials. Preferred techniques to fabricate graphene include carbon deposition onto a Si or SiC substrate, Si sublimation out of SiC, and selective Si etching of SiC. Graphene may be doped during, or following, any of these methods of formation.

Doped graphene may be in the form of a region, a layer, a sheet, a nanostructure (e.g. a nanotube or nanowire), or any other structure. When complex graphene structures are desired, the graphene may first be doped as provided herein; alternatively, or additionally, the graphene structure may be formed and then the doping is carried out.

In some embodiments, doped graphene as provided herein is part of a multilayer structure comprising a substrate as described (e.g., a silicon (111) surface), a transition layer disposed on the substrate, and a graphene layer disposed on the transition surface. Some embodiments of the present invention employ multilayer structures described in co-pending U.S. patent application Ser. No. 12/985,345 to Moon et al. for "METHODS FOR FABRICATING GRAPHENE FILMS ON SILICON SUBSTRATES, AND STRUCTURES DERIVED THEREFROM," filed on Jan. 6, 2011, which is hereby incorporated by reference herein in its entirety for all purposes.

The transition layer (between graphene and substrate), when present, should have an atomic arrangement that is compatible with graphene formation. The transition layer preferably comprises silicon carbide. Silicon carbide has high thermal conductivity, high electric-field breakdown strength, and a very low coefficient of thermal expansion. SiC experiences no phase transitions that would cause discontinuities in thermal expansion. Silicon carbide exists in several hundred crystalline forms. The polymorphism of SiC is characterized by a large family of similar crystalline structures called polytypes. The major SiC polytypes are 4H, 6H (or α), and 3C (or β). In some embodiments, substantially cubic silicon carbide (3C—SiC) forms the transition layer.

When a transition layer is employed, Si (111) is a preferred silicon substrate. Without being limited by theoretical considerations, it is believed that Si (111) can provide better atomic alignment between the Si layer and the transition layer which, in turn, can assist in more-efficient structural formation of the graphene layer.

The thicknesses of the substrate and transition layers may vary and are not regarded as critical to the invention. In some embodiments, the transition layer has a thickness of about 10 µm or less, such as about 2-5 µm. In preferred embodiments, the substrate and the transition layer form an interface with few or no voids.

In some embodiments, forming graphene comprises depositing a cubic silicon carbide transition layer on a silicon (111) surface by molecular-beam epitaxy or chemical-vapor deposition, and then growing a graphene layer on the transition layer. The depositing step is preferably conducted at a temperature from about 800° C. to about 1250° C. The growth temperature is preferably selected to prevent damage to the Si substrate. The phosphorus-containing dopant fluid may be introduced while growing the graphene layer, or following graphene formation.

In some embodiments, forming graphene comprises silicon sublimation out of cubic silicon carbide under vacuum, and at a temperature of about 1200° C. or less. The growth temperature is preferably selected to prevent damage to the Si substrate. The residual carbon after Si sublimation forms a stable configuration of graphene. The phosphorus-containing dopant fluid may be introduced while forming the graphene layer from sublimation, or following graphene formation.

In some embodiments, forming graphene comprises selective silicon etching of cubic silicon carbide. The selective silicon etching may be carried out with chlorine and/or fluorine, for example. A chemically-assisted Si etching process can be done at a reduced temperature (below 1200° C.), leaving the carbon on the surface to form $sp^2$ graphitic structures. In certain embodiments, selective silicon etching comprises layer-by-layer stripping of silicon out of cubic silicon carbide with one or more halides. Any halide may be employed, such as sodium chloride, potassium chloride, potassium iodide, lithium chloride, chlorine fluoride, bromomethane, or triiodomethyl. The phosphorus-containing dopant fluid may be introduced while etching, or following graphene formation.

Some embodiments of the invention dope graphene that is not supported or disposed on a substrate. Such graphene may be a free-standing graphene layer in a device, in solution (e.g., a solvent or an ionic liquid), in a loose matrix to hold a graphene layer in place, and so on.

The present invention provides graphene-based compositions comprising phosphorus, and graphene-based devices incorporating such compositions. Some embodiments provide an n-doped graphene composition comprising graphene and phosphorus atoms or phosphorus-containing molecules or fragments doped within the graphene.

In some embodiments, the n-doped graphene composition is doped with phosphine. In some embodiments, the n-doped graphene composition is doped with one or more phosphine derivatives as described above, for example. The n-doped graphene composition may be doped with one or more phosphorus-containing fragments, such as $PH_4^+$, $PH_2^-$, $.PH_2$, $PH^{2-}$, or atomic P. In some embodiments, the n-doped graphene composition is doped with phosphorus atoms, either substititutionally, interstitially, or both. In certain embodiments, the n-doped graphene composition further comprises hydrogen, oxygen, nitrogen, or other elements.

The present invention provides supported or unsupported graphene compositions having a wide range of sheet-carrier concentrations. Generally, the graphene composition may have sheet-carrier concentrations on the order of $10^{10}$ $cm^{-2}$ (or less), $10^{11}$ $cm^{-2}$, $10^{12}$ $cm^{-2}$, $10^{13}$ $cm^{-2}$, $10^{14}$ $cm^{-2}$, $10^{15}$ $cm^{-2}$, or higher. In some embodiments, the supported or unsupported graphene composition has a sheet-carrier concentration of about $10^{12}$ $cm^{-2}$ or higher, such as about $10^{13}$ $cm^{-2}$ or higher, e.g. about $2\times10^{13}$ $cm^{-2}$, $3\times10^{13}$ $cm^{-2}$, $4\times10^{13}$ $cm^{-2}$, $5\times10^{13}$ $cm^{-2}$ or higher.

A graphene-containing structure may be characterized by "sheet resistance" which is a measure of resistance of thin films that are nominally uniform in thickness. Sheet resistance is applicable to two-dimensional systems where the thin (graphene) film is considered to be a two-dimensional entity. The utility of sheet resistance, as opposed to resistance or resistivity, is that it is typically directly measured. Sheet resistance may be directly measured using a four-terminal sensing measurement (also known as a four-point probe measurement). A four-point probe is used to avoid contact resistance. For this measurement, the current must be flowing along the plane of the graphene sheet, not perpendicular to it. Typically a constant current is applied to two probes and the potential on the other two probes is measured with a high impedance voltmeter. A geometry factor is applied according to the shape of the four-point array.

Various sheet-resistance values can be realized with the present invention. Generally speaking, lower sheet resistances are preferred. In some embodiments, phosphorus-doped graphene as provided herein has an average sheet resistance of about 3000 ohm/sq or less, preferably about 2000 ohm/sq or less (such as about 1000-1500 ohm/sq), and more preferably about 1000 ohm/sq or less (such as about 100-500 ohm/sq).

The n-doped graphene preferably has an average domain size of about 10 nm or more, more preferably about 100 nm or more, and most preferably about 1 μm or more. Larger domain sizes are regarded as preferred for practical reasons (e.g., to be similar to the size of a single device) but are not necessary for the present invention.

Some embodiments utilize multiple layers of graphene wherein at least one graphene layer comprises an n-doped graphene composition as described herein. Additional layers of graphene can be included, if desired, and the additional layers may or may not be doped, or may be doped in a different manner compared to the base graphene layer.

A graphene bilayer (two layers of graphene) can drastically change the electrical properties compared to monolayer graphene. Bilayer graphene consists of two graphene layers that are stacked. Bilayer graphene may be utilized in certain embodiments to introduce a band gap (e.g. by disturbing the layer symmetry), so that the graphene bilayer behaves like a semiconductor. In general, any number of layers of graphene may be fabricated and doped, including 1, 2, 3, or more.

Various carbon nanostructures are possible, wherein the carbon nanostructures comprise an n-doped graphene composition as described herein. For example, carbon nanostructures may be selected from the group consisting of nanotubes, nanohorns, nanowires, nanofoams, nanoribbons, nanofibers, buckytubes, extruded activated carbon, oriented pyrolytic graphite, aerogels, and any combinations thereof. These carbon nanostructures may be useful for device applications.

One or more wide band gap layers may be incorporated into n-doped graphene structures. The wide band gap layer(s) may include, for example, one or more nitrides selected from boron nitride, aluminum nitride, or indium nitride. Alternatively, or additionally, the wide band gap layer may include one or more oxides selected from oxides of silicon, aluminum, titanium, hafnium, or magnesium, such as $SiO_2$, $Al_2O_3$, $HfO_2$, $TiO_2$, for example.

Some embodiments provide a graphene field-effect transistor (FET) comprising an n-doped graphene composition as described herein. For example, a wafer-scale ambipolar graphene field-effect transistor on Si (111) may include a gate region disposed on n-doped graphene, a source region, and a drain region. The source and drain metals and the metal gate are conventional Ti/Pt/Au metal blends, while the gate oxide is $SiO_2$. The metal gates are processed with Ti/Pt/Au metal deposition and lift-off process on top of a $SiO_2$ gate dielectric layer deposited by electron beam evaporation.

In certain embodiments, a top-gated graphene-on-Si FET utilizes a 3C—SiC (111) template grown on a high-resistivity float zone Si (111) substrate. The Si (111) substrate may be various sizes and shapes, such as a circular wafer that is at least about 10-100 mm diameter, e.g. 75 mm. The graphene-on-Si FET may be processed in a layout with a source-drain spacing from about 0.5 μm to about 10 μm, such as about 1 μm or 3 μm. The gate metal (in the gate region) is preferably aligned with a gate-to-source separation of less than 500 nm (e.g., less than about 100 nm) and a gate-to-drain separation of less than 500 nm (e.g., less than about 100 nm). Preferably, the gate-to-source separation and the gate-to-drain separation are about the same as each other.

EXAMPLE 1

Example 1 shows the dependence of electron concentration on various times of phosphine exposure. First, epitaxial multi-layer graphene is grown on 4-inch semi-insulating (111)-oriented Si substrates on a D-180 Emcore MOVPE system. Second, the grown device is reloaded back into the MOVPE system. Then, phosphine gas is introduced for various times while the substrate temperature and flow rate of phosphine are kept constant at 750° C. and 75 sccm, respectively.

Hall measurements at 300 K are performed to assess the electrical properties. The sheet resistances and sheet carrier concentration is 4618 ohm/sq and $8.94 \times 10^{11}$ cm$^{-2}$, respectively, for graphene as grown on Si substrate; and 2508 ohm/sq and $8.14 \times 10^{12}$ cm$^{-2}$ for doped graphene following 90 minutes exposure to phosphine gas (FIG. 3).

Figure 3:
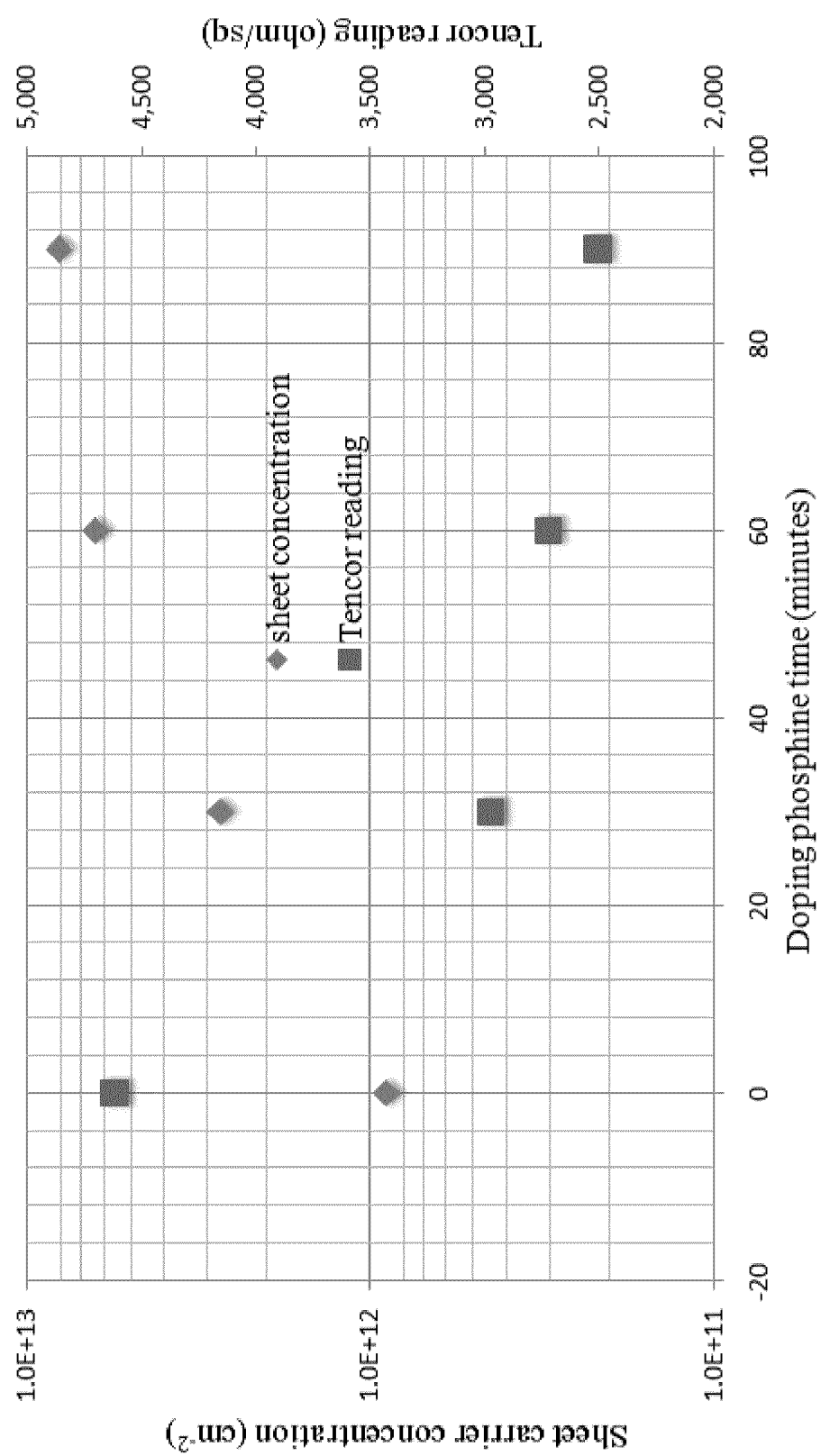
FIG. 3 is a plot of sheet carrier concentration and sheet resistance versus phosphine doping time for n-doped graphene, according to an embodiment in Example 1.

FIG. 3 is a plot of sheet carrier concentration and sheet resistance (Tencor reading) versus phosphine doping time for grown-graphene on 4-inch Si (111) substrates. This data indicates that the longer phosphine exposure leads to higher sheet-carrier (electron) concentrations.

EXAMPLE 2

Example 2 shows the dependence of electron concentration on different doping methods. Exposure time and flow rate of phosphine are kept constant at 30 minutes and 75 sccm, respectively, while the doping method is varied. The experiment labeled EM10-110 is a control, which measures the electrical properties of as-grown graphene with no doping.

In experiment EM10-111, phosphine is exposed on loaded grown-graphene, where doping occurs by diffusion into the fabricated graphene (i.e., doping follows graphene formation). The sheet resistance is measured to be 2,973 ohm/sq, and the sheet-carrier concentration is measured as $2.74 \times 10^{12}$ cm$^{-2}$ in a Hall measurement at 300 K.

In both experiments EM10-116 and EM10-124, phosphine gas is exposed right after growing graphene on 4-inch Si (111) and 3-inch Si (100) (i.e., simultaneous doping with graphene formation). The only difference is experiments EM10-116 and EM10-124 is the choice of substrate; the substrate is 4-inch Si(111) in experiment EM10-116 while the substrate is 3-inch Si(100) in experiment EM10-124. In run EM10-116, the sheet resistance is measured to be 1,527 ohm/sq, and the sheet-carrier concentration is measured as $2.14 \times 10^{13}$ cm$^{-2}$ in a Hall measurement at 300 K. In run EM10-124, the sheet resistance is measured to be 1,497 ohm/sq, and the sheet-carrier concentration is measured as $2.30 \times 10^{13}$ cm$^{-2}$ in a Hall measurement at 300 K.

The results of phosphine doping on different oriented-substrates and for different doping methods in this Example 2 are shown in FIG. 4. The sheet-carrier concentration of the EM10-110 sample is significantly lower than all three of the doped samples, especially the simultaneously doped samples EM10-116 and EM10-124. These doping procedures are therefore effective to increase the sheet-carrier concentration of graphene.

The sheet carrier concentration of experiment EM10-116 is higher than that of experiment EM10-111 by a factor of 10. The results indicate that exposure to phosphine right after growing graphene is preferred, compared to phosphine diffusion into grown graphene. However, the sheet carrier concentrations and sheet resistances of experiments EM10-116 and EM10-124 are not statistically different, indicating that the effectiveness of graphene doping with phosphine is independent of Si substrate crystal orientation.

EXAMPLE 3

Example 3 measures the effective electron concentration of graphene supported on SiC substrates. There are three experiments in this Example 3. The first experiment is to grow graphene on a SiC substrate without phosphine doping, i.e., a control. The second experiment is to diffuse phosphine on graphene/SiC for 15 minutes at 750° C. and 75 sccm phosphine. The third experiment is to diffuse phosphine on graphene/SiC for 30 minutes at 750° C. and 75 sccm phosphine.

Results of phosphine-doped graphene on SiC substrates are shown in FIG. 5. After 15 minutes of phosphine diffusion, the sheet resistance does not change significantly, indicating that phosphine (or its fragments) is not incorporated into graphene on SiC substrates in 15 minutes, at the selected temperature (750° C.) and phosphine flow rate (75 sccm). However, after 30 minutes, the sheet resistance and sheet-carrier concentration significantly improve.

Exposure of graphene-on-SiC to pure phosphine gas (100%) with a flow rate of 75 sccm at a temperature of 750° C. for 30 minutes doping time gives graphene with a sheet resistance of less than 150 ohm/sq and sheet-carrier concentration of about $5 \times 10^{13}$ cm$^{-2}$.

Variations of the present invention have a variety of important uses. This invention can apply to any systems that utilize or could utilize graphene-based electronics, ranging from high-performance high-speed electronics, MEMS or NEMS, flexible electronics, high-bandwidth communications, memory systems, low-noise amplifiers, radar systems, and sensors (including infrared, chemical, and biological sensors). This silicon-compatible graphene technology may enable the co-integration of graphene FETs and silicon-CMOS FETs.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan. This invention also incorporates routine experimentation and optimization of the structures, systems, and methods described herein.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method of n-type doping of graphene, said method comprising introducing a phosphorus-containing and hydrogen-containing dopant fluid to a surface of graphene, under effective conditions in a vacuum chamber at a pressure greater than 10 torr and less than 50 torr, to dope said graphene with phosphine fragments each consisting of phosphorus in molecular combination with hydrogen, wherein said phosphorus-containing and hydrogen-containing dopant fluid is selected from the group consisting of phosphine, starting phosphine fragments, phosphine derivatives, and combinations thereof, and wherein said doping is substitutional doping of said phosphine fragments into said graphene.

2. The method of claim 1, wherein said phosphorus-containing dopant fluid comprises phosphine gas.

3. The method of claim 1, wherein said phosphorus-containing dopant fluid comprises a phosphine derivative, $PR_1R_2R_3$ wherein each of $R_1$, $R_2$, and $R_3$ are independently selected from hydrogen, a hydroxyl group, or hydrocarbon groups capable of bonding with phosphorus, and wherein at least one of $R_1$, $R_2$, and $R_3$ is not hydrogen.

4. The method of claim 1, wherein said phosphorus-containing dopant fluid comprises a halogenated phosphine derivative.

5. The method of claim 1, wherein said phosphorus-containing dopant fluid comprises phosphine oxide or a phosphine oxide derivative.

6. The method of claim 1, said method comprising incorporating hydrogen into said graphene during said doping.

7. The method of claim 1, wherein said graphene is supported on a substrate.

8. A method of forming n-doped graphene, said method comprising growing epitaxial graphene by carbon deposition on a substrate layer while simultaneously introducing a phosphorus-containing and hydrogen-containing dopant fluid in a vacuum chamber at a pressure greater than 10 torr and less than 50 torr, to dope said graphene, during graphene growth, with phosphine fragments each consisting of phosphorus in molecular combination with hydrogen, wherein said phosphorus-containing and hydrogen-containing dopant fluid is selected from the group consisting of phosphine, starting phosphine fragments, phosphine derivatives, and combinations thereof, wherein said doping is substitutional doping of said phosphine fragments into said graphene, and wherein said substrate layer is selected from the group consisting of Si (111), Si (100), SiC, and combinations thereof.

9. The method of claim 8, wherein said phosphorus-containing dopant fluid comprises phosphine gas.

10. The method of claim 8, wherein said phosphorus-containing dopant fluid comprises a phosphine derivative, $PR_1R_2R_3$ wherein each of $R_1$, $R_2$, and $R_3$ are independently selected from hydrogen, a hydroxyl group, or hydrocarbon groups capable of bonding with phosphorus, and wherein at least one of $R_1$, $R_2$, and $R_3$ is not hydrogen.

11. The method of claim 8, wherein said phosphorus-containing dopant fluid comprises a halogenated phosphine derivative.

12. The method of claim 8, wherein said phosphorus-containing dopant fluid comprises phosphine oxide or a phosphine oxide derivative.

13. The method of claim 8, said method comprising incorporating hydrogen into said graphene during said doping.

14. The method of claim 8, wherein said substrate layer is selected from Si (111) or Si (100).

15. An n-doped graphene composition comprising graphene and phosphine fragments that are substitutionally doped within said graphene, wherein said phosphine fragments each consist of phosphorus in molecular combination with hydrogen, and wherein said phosphine fragments do not include $PH_3$.

16. A multi-layer graphene composition wherein at least one graphene layer comprises an n-doped graphene composition in accordance with claim 15.

17. A graphene field-effect transistor comprising an n-doped graphene composition in accordance with claim 15.

18. An electronics device comprising an n-doped graphene composition in accordance with claim 15.

19. An n-doped graphene composition substitutionally n-type-doped with fragments of a phosphine derivative, $PR_1R_2R_3$, wherein each of $R_1$, $R_2$, and $R_3$ are independently selected from hydrogen, a hydroxyl group, or hydrocarbon groups capable of bonding with phosphorus, wherein at least one of $R_1$, $R_2$, and $R_3$ is not hydrogen, wherein said fragments of a phosphine derivative each consist of, in molecular combination, phosphorus and at least one of $R_1$, $R_2$, and $R_3$, and wherein said fragments do not include $PR_1R_2R_3$ itself.

20. A supported graphene composition comprising an n-doped graphene composition comprising graphene and phosphine fragments that are substitutionally doped within said graphene, wherein said phosphine fragments each consist of phosphorus in molecular combination with hydrogen, and wherein said phosphine fragments do not include $PH_3$; said supported graphene composition further comprising a substrate for said graphene, wherein said substrate is selected from the group consisting of Si (111), Si (100), SiC, and combinations thereof.

21. The supported graphene composition of claim 20, wherein said substrate is doped with said phosphine or phosphine fragments.

* * * * *